(12) United States Patent
Artmann et al.

(10) Patent No.: US 6,759,265 B2
(45) Date of Patent: Jul. 6, 2004

(54) METHOD FOR PRODUCING DIAPHRAGM SENSOR UNIT AND DIAPHRAGM SENSOR UNIT

(75) Inventors: Hans Artmann, Magstadt (DE); Thorsten Pannek, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/268,711

(22) Filed: Oct. 10, 2002

(65) Prior Publication Data

US 2003/0110867 A1 Jun. 19, 2003

Related U.S. Application Data

(62) Division of application No. 10/020,353, filed on Dec. 12, 2001, now Pat. No. 6,521,313.

(51) Int. Cl.[7] ............................................... H01L 21/00
(52) U.S. Cl. ............................. 438/53; 438/50; 438/619
(58) Field of Search ........................... 438/53, 50, 619; 216/2; 73/862, 504, 514

(56) References Cited

U.S. PATENT DOCUMENTS

| | | | |
|---|---|---|---|
| 4,665,610 A | * | 5/1987 | Barth ........................... 29/580 |
| 4,849,071 A | * | 7/1989 | Evans et al. ................. 156/644 |
| 5,344,523 A | * | 9/1994 | Fung et al. .................. 156/628 |
| 5,604,144 A | | 2/1997 | Kurutz |
| 5,662,814 A | | 9/1997 | Sugino |
| 6,004,471 A | | 12/1999 | Chuang |
| 6,287,979 B1 | | 9/2001 | Zhou et al. |
| 6,319,743 B1 | * | 11/2001 | Marchant et al. ............. 438/50 |
| 2003/0116813 A1 | * | 6/2003 | Benzel et al. ............... 257/414 |

OTHER PUBLICATIONS

G. Lammel and P. Renaud, "Free–Standing, Mobile 3D Microstructures of Porous Silicon," EuroSensors XIII, The 13th European Conference on Solid–State Transducers, pp. 535–536, Sep. 12–15, 1999, The Hague, The Netherlands.

* cited by examiner

Primary Examiner—Alexander Ghyka
(74) Attorney, Agent, or Firm—Kenyon & Kenyon

(57) ABSTRACT

In a method for producing a diaphragm sensor unit having a semiconductor material substrate, a flat diaphragm and an insulating well for thermal insulation below the diaphragm are generated, for the formation of sensor element structures for at least one sensor. The substrate, made of semiconductor material, in a specified region, which defines sensor element structures, receives a deliberately different doping from the surrounding semiconductor material, that porous semiconductor material is generated from semiconductor material sections between the regions distinguished by doping, and semiconductor material in the well region under semiconductor is rendered porous and under parts of the sensor element structure is removed and/or rendered porous.

6 Claims, 2 Drawing Sheets

METHOD FOR PRODUCING DIAPHRAGM SENSOR UNIT AND DIAPHRAGM SENSOR UNIT

This is a divisional of application Ser. No. 10/020,353, filed Dec. 12, 2001, now U.S. Pat. No. 6,521,313.

FIELD OF THE INVENTION

The present invention relates to a method for producing a diaphragm sensor unit and to a diaphragm sensor unit.

BACKGROUND INFORMATION

Methods for producing a diaphragm sensor unit having a semiconductor material substrate, in which, for the purpose of forming sensor element structures, at least one planar diaphragm and, under the diaphragm, an insulation well for thermally insulating the diaphragm are provided, are conventional. If the diaphragm sensor unit includes several planar diaphragm areas, these are separated at regular intervals from one another by crosspieces made of a material having clearly better heat conducting properties compared to the diaphragm and the lateral surroundings of the crosspieces.

Conventional diaphragm sensors are generally fashioned as thin film diaphragms. For this purpose, layer systems in thicknesses between a few 10 nm and a few micrometers are deposited on a carrier substrate and after that, the carrier substrate is removed in predefined areas, so as to obtain self-supporting diaphragm areas. Then, for example, sensor elements are mounted in the center of the diaphragm, which are thermally decoupled from the surrounding carrier substrate by the self-supporting arrangement of the diaphragm, which is desirable for temperature and flow-sensing sensors.

For the purpose of exposing the diaphragm there are two different methods:

1. Surface micromechanics (SMM), in which, in general, a sacrificial layer is used, which is deposited on the component side of a carrier substrate before the separation of the diaphragm. The sacrificial layer is later removed from the component side of the sensor through "detachment openings" in the diaphragm, whereby a self-supporting structure is created. These surface micromechanical methods are comparatively costly, due to the necessity for separate sacrificial layers.
2. Bulk micromechanics, in which the diaphragm is exposed from the backside by an etching step, i.e., an opening is etched through the entire thickness of the wafer.

For many applications, arrays (groupings) of sensors are required. For this purpose, several like sensors are arranged side-by-side in linear or two-dimensional fashion. Where thermosensors are involved, they have to be separated from one another by heat sinks so as to make possible spatial resolution of the measuring signal.

There are a number of possibilities for producing heat sinks. Frequently, this involves depositing a layer of a good heat conductive material on the surface of the diaphragm, and structuring it so that the remaining structures of the good heat conductive material act as heat sinks.

However, as described above, one can also expose the diaphragm by bulk micromechanical processes so that crosspieces of the bulk material remain between the individual diaphragm areas. In the case of bulk micromechanical diaphragm sensors, the diaphragm is usually exposed from the backside by an anisotropic etching process, for example, using KOH (potassium hydroxide). However, despite its anisotropic properties, the etching requires considerably more space on the backside of the substrate than would be necessary for the actual diaphragm structure. Therefore this process limits the integration density.

SUMMARY

It is an object of the present invention to improve the production of diaphragm sensors with regard to cost and density of integration.

The above and other beneficial objects of the present invention are achieved by providing a method and a diaphragm sensor unit as described herein.

The present invention relates a method for producing a diaphragm sensor unit using a semiconductor material substrate, in which a flat diaphragm and an insulating well for thermal decoupling are generated under the diaphragm, for the formation of sensor element structures for at least one sensor. In the sense of the present invention, the term diaphragm refers not only to a self-supporting layer, but, in the simplest case, also to a layer positioned above an insulating well area which is made of a comparatively better insulating material. Thus, in accordance with the present invention, the substrate is made of semiconductor material, in a specified region which defines sensor element structures, receives a purposefully different doping from the surrounding semiconductor material, porous semiconductor material is generated from semiconductor material sections between the regions distinguished by doping, and semiconductor material in the well region under semiconductor material is rendered porous and under parts of the sensor element structures is removed and/or rendered porous. For this procedure, porous semiconductor material having a distinctly larger surface has a significantly lower heat conductivity than bulk semiconductor material. Through this, for example, sections of semiconductor material within the diaphragm, which have not been rendered porous, are thermally insulated in the lateral direction by the diaphragm material. Insulation of such a semiconductor region in the downward direction is achieved by the insulating well region. This may be formed either as a cavity or as semiconductor material itself rendered porous. By the use of measures according to the present invention, the diaphragm sensor unit may be entirely made of the semiconductor substrate material, except for a second material layer for the formation of a thermocouple element, which simplifies the production process and lowers production costs.

The geometrical extension of the diaphragm structures may be controlled in a simple manner by doping processes and selective etching processes, whereby particularly the thermoelectric power of thermocouples is easy to set.

During the production of porous semiconductors, such as porous silicon, an electrochemical reaction between hydrofluoric acid and silicon is used, during which a sponge-like structure is formed in the silicon. For this, the silicon semiconductor substrate (e.g., a silicon wafer) has to be polarized anodically with respect to hydrofluoric acid electrolyte. By electrochemical etching of the silicon (anodizing) in, for example, a mixture of hydrofluoric acid and ethanol, porous silicon is generated by the etching proceeding more deeply. For the etching of silicon, defect electrons (holes) are necessary at the interface between silicon and the electrolyte, which are made available by the flowing current. If the current density is less than a critical current density $j_{KRIT}$, holes diffuse to recesses extending in the surface, because of the applied electrical field, and there an etching occurs. In the case of, for example, p-doped silicon, the regions between the recesses are etched laterally up to a minimum thickness, until no more holes may penetrate into these regions because of quantum effects, and the etching process is stopped. In this manner a sponge-like skeleton structure is created, made of silicon and etched-free pores. During the formation of the skeleton structure, since the etching process occurs only in the area of the tips of the pores, the spongy structure of silicon already etched is maintained. Along with that, the size of the pores in the regions already etched remains nearly unchanged. The size of the pores depends on the HF concentration in the hydrofluoric acid, on the doping and on the current density, and may amount to from a few nanometers to a few 10 nm. Likewise, the porosity may be set in a range from approximately 10% to more than 90%.

Various doped substrates may be used for producing porous silicon. Generally, p-doped wafers having different degrees of doping may be used. The structure within the porous silicon may be determined by the doping.

For producing porous silicon locally, p-doped and n-doped silicon demonstrate sharply different etching behaviors. With the conditions under which porous silicon may be generated in p-doped silicon, in n-doped silicon this is not possible, or possible only to a small extent. Therefore, a layer at the surface of the p-doped substrate may be n-redoped for the purpose of determining the sensor element structures (by ion implantation or diffusion). During electrochemical etching, porous silicon is created only in p-doped regions. Generation of porous silicon may be matched to the thickness of the n-redoped layer. In this manner, a structure is obtained in which a silicon layer rendered porous is arranged between n-redoped regions.

In an example embodiment of the present invention, the semiconductor material rendered porous is oxidized after the generation of the insulating well region. This further reduces the heat conductivity of the structure rendered porous.

Beyond that, in an example embodiment of the present invention, the deliberately differently doped regions are provided with a protective layer to protect them from generation of porous, oxidized semiconductor material. In a silicon wafer, for example, the n-redoped silicon is additionally coated with a silicon nitride layer, which protects the n-redoped areas.

This passivating layer may be removed after the generation of semiconductor material that is porous and oxidized if indicated.

The insulating well region may be formed as a cavity or of highly porous material.

In another example embodiment of the present invention, aluminum, for example, is deposited as a material layer for generating a thermocouple element onto semiconductor areas, distinguished by doping, inside the semiconductor material which has been rendered porous and has been oxidized if indicated, which form sensor element structures, i.e., semiconductor areas which are bordered by material that has been rendered porous, but which are not porous themselves.

Generating a thermocouple element from semiconductor material regions arranged between semiconductor materials which have been rendered porous and have been oxidized if indicated, is particularly achieved by simply depositing a further layer, during the generation of porous and, if indicated, oxidized semiconductor material, if the semiconductor regions, distinguished by doping, are protected by a passivating layer. Because, after removal of the passivating layer, the desired semiconductor surface is then available (without, for example, a harmful "oxide skin") for the formation of a thermocouple element. N-redoped silicon is protected, for example, as mentioned above, by a silicon nitride layer, the thermocouple element being able to be generated by depositing an aluminum layer after removal of the silicon nitride layer.

Furthermore, the present invention relates to a diaphragm sensor unit, having a substrate made of semiconductor material, which, for the purpose of forming sensor element structures for at least one sensor, includes one diaphragm and one insulating well, arranged below the diaphragm, for the thermal insulation of the diaphragm. The essential aspect of the diaphragm sensor unit is that the diaphragm includes semiconductor material sections made of semiconductor material which has been rendered porous and oxidized if indicated. This makes possible a particularly simple construction of a diaphragm sensor unit having the comparatively good thermal insulation of a thermocouple element.

This construction is additionally simplified if no porous or oxidized semiconductor regions are arranged in the diaphragm which may be used as printed circuit traces or as element of a thermocouple for a thermocouple element. As described above, in such a construction, a thermocouple element may then be generated in a simple manner by direct application of a further layer, using appropriate structuring.

For the use as a thermocouple element, the insulating well under the diaphragm may be formed as a cavity. For the application area as a flow sensor, the insulating well may be configured as a highly porous semiconductor material.

By the exact production of porous semiconductor material and the remaining semiconductor material regions, diaphragm sensor arrays may be constructed, for example, using the above-described method, which have high integration density and yet guarantee good separation of the individual diaphragm sensor units from one another.

DETAILED DESCRIPTION

Figure 1A:
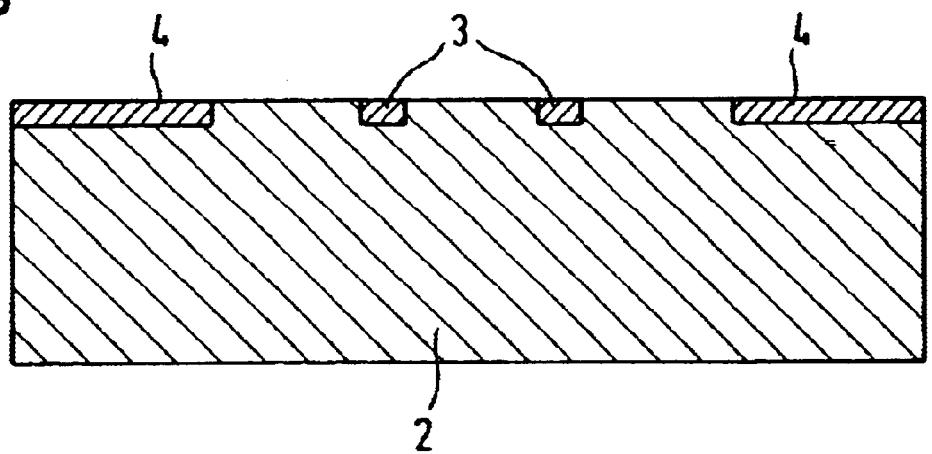
FIGS. 1a to 1c are schematic cross-sectional views of a silicon substrate for the production of a diaphragm sensor having a porous silicon diaphragm, each as a schematic cross-section illustrating a different production stage.
Figure 1B:
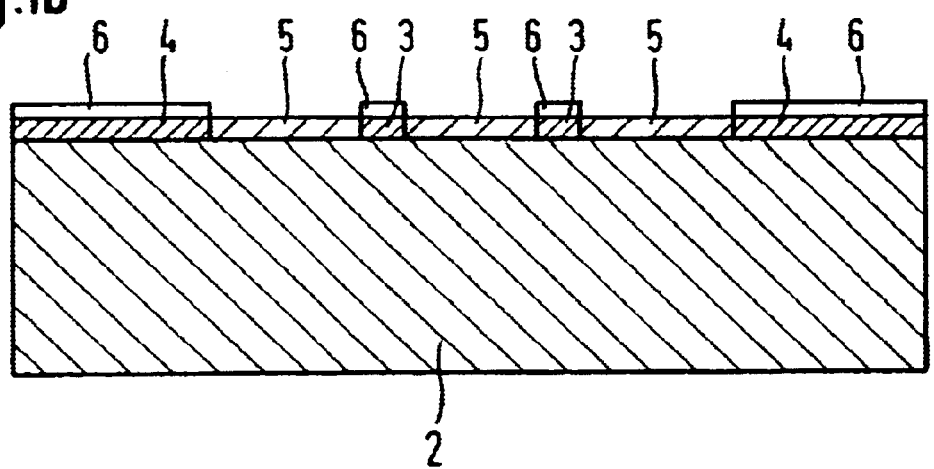
Figure 1C:
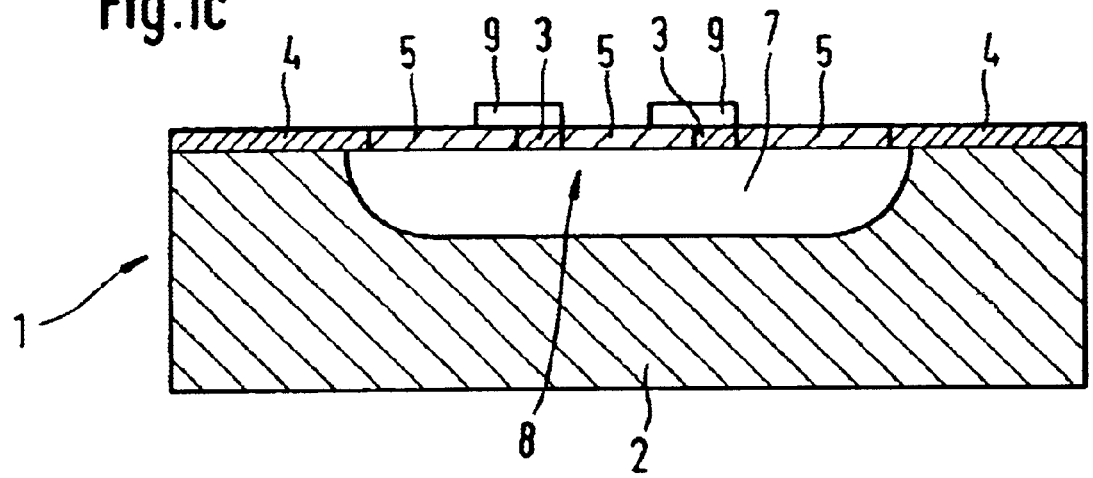

FIGS. 1a to 1c illustrate in each case a schematic step illustration of the generation of a diaphragm sensor 1 on the basis of a p-doped silicon wafer 2.

In a first step, for example, n-doped regions 3, 4 are generated by ion implantation, which are to be used later as printed circuit traces and elements of thermocouples or sensor margin (see FIG. 1a).

P(e.g., ≈0.02 Ωcm)-doped regions of silicon substrate 2 between regions 3, 4 are rendered porous and form mesoporous regions 5 (for example, porosity 10 to 65%; layer thickness≈1 to 10 $\mu$m or more; current density≈1 to 50 mA/cm$^2$; HF concentration≈15 to 40%). The porosity of regions 5 is adjusted, depending on the application, (high porosity >55% for thermal decoupling). The n-doped regions 3, which are used as elements of thermocouples are within regions 5. Before the generation of porous regions 5, n-doped regions 3, 4 were provided with a silicon nitrite layer 6 as a protective layer for the porous-rendering procedure. This silicon nitrite layer 6 is removed again after the porous-rendering.

Subsequently, a cavity 7 is generated below regions 3, 5 all the way through the porous regions, using suitable methods.

This etching step may be performed by silicon gas phase etching through the pores of regions 5, or by electropolishing (using, for example, HF concentrations of 2 to 20%; current density >50 mA/cm$^2$) also through the pores of regions 5.

The etching process is isotropic, so that etching of p-doped semiconductor material also appears in the lateral direction. In this manner is created continuous cavity 7, illustrated schematically in FIG. 1c, by complete undermining of n-doped regions 3 and by partial undermining of n-doped regions 4. Thus, cavity 7 is covered by regions 3, 4 and 5, which form a diaphragm 8.

In order to stabilize mesoporous regions 5 and reduce still further their heat conductivity, they may additionally be oxidized.

For the improvement of the long-term stability of partially porous diaphragm 8, it can be sealed by a CVD (chemical vapor deposition) surface layer. Before or after the generation of cavity 7 with appropriate undermining, the additional structures needed for a thermocouple element, especially the second elements of the thermocouple, are generated.

For temperature and flow sensors 3, for example, elements of a thermocouple 9 made of aluminum or p-doped polysilicon are arranged on the n-redoped silicon regions 3.

Figure 2:
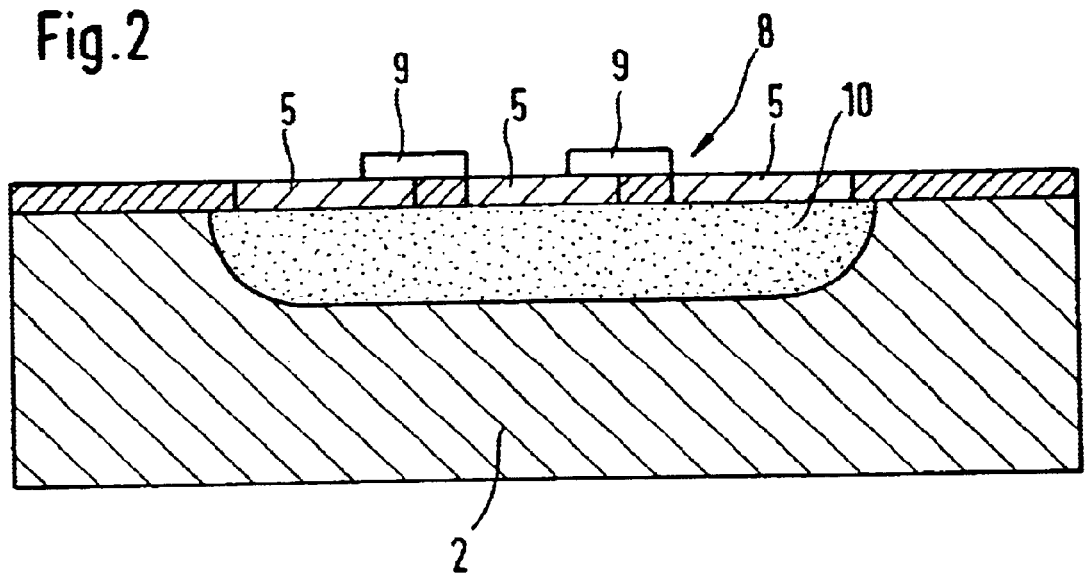
FIG. 2 is schematic cross-sectional view of a diaphragm sensor having a porous silicon diaphragm and an insulating, porous well region lying below it.

Particularly in the case of flow sensors (see FIG. 2), the semiconductor material below the diaphragm in well region 10 may also be rendered porous and be oxidized. A nanoporous silicon region may be created by an appropriate etching process all the way through porous regions 5. In this case, the degree of porosity is set comparatively high (>60%), in order to minimize the mass of the remaining silicon, but still to guarantee sufficient stability. The porous silicon thus generated in well region 10 may subsequently be oxidized, in order to convert the comparatively good heat conductive silicon into less heat conductive porous silicon oxide. The heat conductivities of the individual materials have values as follows:

silicon≈150 W/Km silicon oxide 1.4 W/Km silicon rendered nanoporous 1 to 2 W/Km oxidized silicon rendered nanoporous 0.3 to 1.4 W/Km In order to achieve good heat insulation in the direction toward semiconductor substrate 2, the thickness of well region 10 is selected as large as possible (e.g., 50 to 150 μm).

A surface coating for sealing diaphragm 8 and especially porous regions 5, as well as elements of thermocouple 9, which form the second thermocouple element, may be generated by depositing and structuring (wet-chemically or physically/dry-chemically) of CVD (chemical vapor deposition) layers or sputter layers.

Figure 3:
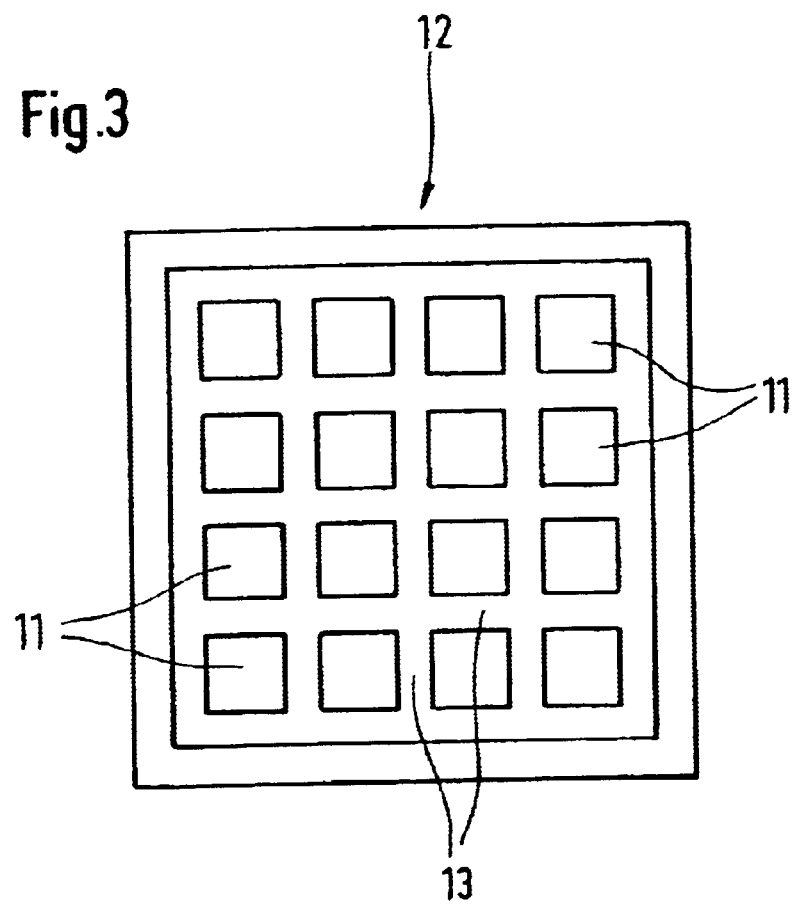
FIG. 3 is a schematic top view of a diaphragm sensor array

Due to the comparatively good heat conductivity of monocrystalline silicon, n- or p-doped silicon regions may be used to decouple thermally individual pixel 11 from sensor array 12 (see FIG. 3).

This decoupling is needed, above all, for highly integrated sensor arrays, in order to prevent thermal cross feed among individual pixels 11.

According to the method described above, it is possible to generate requisite heat sinks 13 at the same time that diaphragm 8 is being generated with its underlying well region 7, 10. Thus, using the method according to the present invention, particularly highly integrated sensor arrays may be constructed.

What is claimed is:

1. A diaphragm sensor unit, comprising:

a substrate made of a semiconductor material;

a planar diaphragm configured to form sensor element structures for at least one sensor; and an insulating well positioned below the diaphragm and configured to thermally insulate the diaphragm;

wherein the diaphragm include semiconductor material sections made of at least one of porous and oxidized semiconductor material, and wherein at least a portion of the insulating well includes highly porous semiconductor material.

2. The diaphragm sensor unit according to claim 1, further comprising non-porous semiconductor regions positioned in the diaphragm and configured to form printed circuit traces.

3. The diaphragm sensor unit according to claim 1, wherein the insulating well includes a cavity.

4. A diaphragm sensor array, comprising:

a plurality of diaphragm sensor units, each diaphragm sensor unit a substrate made of a semiconductor material;

a planar diaphragm configured to form sensor element structures for at least one sensor; and an insulating well positioned below the diaphragm and configured to thermally insulate the diaphragm;

wherein the diaphragm include semiconductor material sections made of at least one of porous and oxidized semiconductor material, and wherein at least a portion of the insulating well includes highly porous semiconductor material.

5. The diaphragm sensor array according to claim 4, wherein each diaphragm sensor unit further includes non-porous semiconductor regions positioned in the diaphragm and configured to form printed circuit traces.

6. The diaphragm sensor array according to claim 4, wherein the insulating well includes a cavity.

* * * * *

UNITED STATES PATENT AND TRADEMARK OFFICE
CERTIFICATE OF CORRECTION

PATENT NO. : 6,759,265 B2
DATED : July 6, 2004
INVENTOR(S) : Hans Artmann et al.

It is certified that error appears in the above-identified patent and that said Letters Patent is hereby corrected as shown below:

<u>Column 6,</u>
Line 37, after "sensor unit" insert -- including: --.

Signed and Sealed this

Twenty-sixth Day of April, 2005

JON W. DUDAS
*Director of the United States Patent and Trademark Office*